United States Patent [19]
Mixon et al.

[11] Patent Number: 4,935,094
[45] Date of Patent: Jun. 19, 1990

[54] NEGATIVE RESIST WITH OXYGEN PLASMA RESISTANCE

[75] Inventors: David A. Mixon, Basking Ridge; Anthony E. Novembre, Union, both of N.J.

[73] Assignee: AT&T Bell Laboratories, Murray Hill, N.J.

[21] Appl. No.: 358,311

[22] Filed: May 26, 1989

[51] Int. Cl.$^5$ .................. B44C 1/22; B29C 37/00; C03C 15/00; C03C 25/06
[52] U.S. Cl. .................. 156/643; 156/646; 156/659.1; 156/661.1; 156/668; 156/904; 427/43.1; 430/296; 430/313
[58] Field of Search ............ 156/643, 646, 655, 659.1, 156/661.1, 662, 668, 904; 430/296, 313; 427/43.1

[56] References Cited
U.S. PATENT DOCUMENTS

| | | | |
|---|---|---|---|
| 4,481,049 | 11/1984 | Reichmanis et al. | 156/643 |
| 4,521,274 | 6/1985 | Reichmanis et al. | 156/904 X |
| 4,701,342 | 10/1987 | Novembre | 427/38 |

OTHER PUBLICATIONS

*Photoresist Materials and Processes,* W. S. DeForrest, p. 223, McGraw-Hill, New York, 1975.
*Polymer Chemistry,* Malcolm P. Stevens, Addison-Wesley, 1973, Chapter 2.
*Principles of Polymerization,* G. Odian, Chapters 3 and 6, J. Wiley & Sons, New York, 1981.
*Introduction to Microlithography,* Chapter 6, edited by L. F. Thompson, C. G. Willson, and M. J. Bowden, American Chemical Society, Symposium Serial 219, Washington, D.C., 1983.
*CRC Critical Reviews in Solid State Science,* M. J. Bowden, p. 231, (Feb. 1979).

*Primary Examiner*—William A. Powell
*Attorney, Agent, or Firm*—Bruce S. Schneider

[57] ABSTRACT

Polymers formed from monomers such as chloromethyl styrene and trimethylgermylmethyl methacrylate form negative-acting resists that are extremely sensitive to exposure by electron beam and deep UV radiation. These materials are particularly useful in bilevel resist applications for fabricating masks or for device processing.

8 Claims, 1 Drawing Sheet

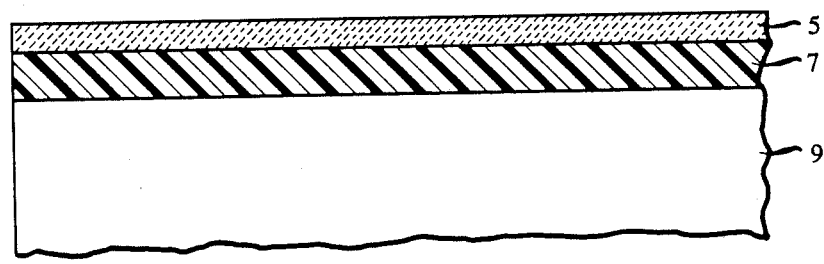

NEGATIVE RESIST WITH OXYGEN PLASMA RESISTANCE

BACKGROUND OF THE INVENTION

1. Field of the Invention

This invention relates to fabrication of electronic devices and, in particular, the fabrication procedures utilizing lithographic techniques.

2. Art Background

Trilevel resists—resists especially suitable for the lithographic definition of small features, i.e., features smaller than 2 μm—have been utilized in the formation of lithographic masks and in the formation of electronic devices. In the former case, the resist is generally delineated with a directed electron beam and an underlying metal layer, e.g., a gold containing layer of an X-ray mask, is then etched to produce the desired mask. In the latter case, the resist is delineated with a directed electron beam, or a previously fabricated mask is employed with exposing radiation, e.g., deep UV, X-ray, or near UV, to delineate the resist.

Trilevel resists include an underlying layer generally deposited directly on the substrate being processed. (The substrate in this context is a mask blank or the semiconductor body including, if present, various levels of, for example, metalization, doped semiconductor material, and/or insulators.) Since the substrate typically, at least for device fabrication, does not have a planar surface, this layer is usually deposited with a thickness that is sufficient, despite the underlying irregularity, to present an essentially planar upper surface. An intermediary layer is then formed on this planarizing layer. The composition of the intermediary layer is chosen so that it is etched at least 5 times slower than the planarizing layer by a plasma that is capable of removing the underlying layer. A third layer (an overlying layer) that is delineable by exposure to radiation and by subsequent treatment with a suitable developing medium is formed on the intermediary layer.

The trilevel resist is patterned by first delineating the overlying layer in the desired pattern. This pattern is then transferred to the intermediary layer through conventional techniques such as dry processing, e.g., reactive ion etching, causing an uncovering, in the desired pattern, of the underlying layer. The uncovered regions, generally of organic materials, are then removed with an oxygen plasma. Intermediary layers of materials such as silicon dioxide, that are essentially unaffected by an oxygen plasma, are employed to avoid its destruction during plasma processing and thus degradation of the transferred pattern.

Although the trilevel resist has proven to be an excellent expedient for producing fine features, it does involve several discrete processing steps. Since there is always a desire to reduce processing steps and the associated costs, there has been a significant effort to develop a bilevel system yielding the advantages, i.e., planarization and high resolution, of a trilevel system. Attempts typically have been made to combine the attributes of the intermediary layer and the overlying layer into a single layer. To effect this combination, the resultant layer should be both delineable by exposure to a nominal dose of radiation and also should be at least 5 times more resistant than the underlying layer to the medium utilized to develop the underlying layer.

Other properties that depend on the particular resist application are also desirable for the overlying layer of a bilevel resist. For example, since masks or custom devices formed at least in part by direct writing are typically fabricated by relatively slow electron beam exposure, the relationship of resist tone to mask geometry is often chosen to minimize the area to be exposed and, in turn, to reduce exposure time. Thus, certain mask geometries, those with a majority of transparent area, are more quickly exposed with a negative-acting resist overlying layer—a layer in which a portion of the exposed material remains after development. In contrast, certain mask geometries, those with a majority of opaque areas, are more quickly exposed with a positive-acting resist overlying layer—a layer in which all the exposed material is removed after development.

For trilevel processing with relatively rapid exposure techniques, e.g., UV exposure, positive resist materials have typically been utilized, at least in part, because they generally afford higher resolution. For example, a resist material described in commonly assigned U.S. Pat. No. 4,481,049, issued Nov. 6, 1984, which is hereby incorporated by reference, has been disclosed for such uses. However, an excellent negative acting resist that is a copolymer of a silicon containing methacrylate monomer with a chloromethylated styrene monomer has been described in U.S. Pat. No. 4,701,342 issued Oct. 20, 1987, which is hereby incorporated by reference. This patent describes a desirable resist that achieves resistance to an etchant such as oxygen plasma by incorporation of silicon into the copolymer. Although this material is quite advantageous, even further improvement of sensitivity to exposing radiation without loss of etch resistance is desirable.

Generally, however, improvement in sensitivity occurs at the cost of lost etch resistance. One attempt at maintaining etch resistance while improving sensitivity is described in *Journal of Imaging Science*, Vol. 30, No. 4, July/August 1986 and *Macromolecules*, Vol. 20, pages 10–15, 1987. In these papers a tin containing polymer is produced which, due to the tin, has a substantial dry etch resistance in an oxygen plasma. However, as indicated in these papers, sensitivity was not substantially improved relative to the corresponding silicon containing polymer.

SUMMARY OF THE INVENTION

A material suitable for use in bilevel resists yielding excellent etch resistance and having enhanced sensitivity to electron and deep UV radiation has been found. In a bilevel configuration, the bilevel resist includes a conventional underlying layer, e.g., a novolac-based resist such as hard-baked HPR-204 (a proprietary product of Philip A. Hunt Chemical Company which is basically a novolac resin with a naphthoquinone diazide sensitizer). The embodiment further includes an overlying layer formed by the polymerization of at least 2 different monomers. These polymers are those produced from monomers including at least one monomer chosen from the group represented by:

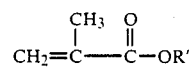

where R' is a germanium-containing moiety such as a germanium alkyl or lower alkoxy represented by the formula:

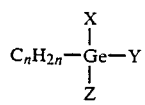

n being 1, 2, or 3 and X, Y, and Z being any combination of ethyl, methyl, or methoxy; and further including at least one monomer chosen from the group represented by:

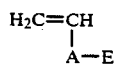

where A is a phenyl or naphthyl moiety, where E is chloro, chloromethyl, dichloromethyl, or bromomethyl, and where E is substituted on the naphthyl or phenyl ring at a position that avoids steric effects that preclude polymerization. Surprisingly, the resist of the invention relative to the corresponding silicon-containing material exhibits enhanced sensitivity for the materials having equivalent oxygen plasma etching rates. Additionally, the germanium-containing material of this invention has a significantly greater etch resistance to an etchant, e.g. an oxygen plasma, than the corresponding silicon resist, for the materials having equivalent sensitivities. Thus, to maintain equivalent etching resistance, a smaller mole percent of germanium containing monomer (group I) in the copolymer is required. The resulting greater mole percentage of group II monomer in the copolymer of this invention yields greater sensitivity.

DETAILED DESCRIPTION

As discussed, in one embodiment a bilevel resist including an underlying layer, 7, and an overlying layer, 5, that is delineable and that is resistant to the medium utilized to develop the underlying layer is typically deposited on a substrate, 9. The material utilized for the underlying layer is not critical and typically includes organic materials such as novolac and polyimide resins, e.g., (1) HPR-204 (a proprietary product of Philip A. Hunt Chemical Company) which is basically a novolac resin with a substituted naphthoquinone diazide solution inhibitor baked, for example, at 210° C., for 1 hour and (2) polyimides such as Pyralin (a proprietary material of E. I. duPont deNemours, Inc.).

The underlying layer material, unlike a typical resist, need not undergo a chemical change upon exposure to radiation. It is only necessary that the material of the underlying resist layer be removable with an oxygen plasma and not appreciably dissolve in the solvent utilized to form the overlying layer. (See VLSI Technology, Chapter 8, edited by S. M. Sze, McGraw-Hill, New York, 1983, for a complete description of the removal of materials through plasma techniques). Appreciable dissolution in this context means the intermixing of the overlying layer with the material from more than 500 Å of the underlying layer. The thickness of the underlying layer depends on the size of the surface irregularities in the substrate. For typical structures utilized in the formation of semiconductor devices, layer thicknesses greater than 1 μm yield an essentially planar surface. For the fabrication of masks, thicknesses in the range 0.5 μm to 2.0 μm are usually employed. However, thicknesses greater than 4 μm, although not precluded, are generally uneconomic and require excess processing time.

The thickness of the overlying layer depends on the desired resolution and the oxygen plasma etching resistance of this layer. Generally, the thicker the layer, the poorer the resolution. For resolutions less than 2 μm, layer thicknesses in the range 0.3 μm to 1.0 μm are typically utilized. Suitable layer thicknesses for either the underlying or overlying layers are easily obtained by conventional techniques such as by dissolving the material that is to form the layer in a solvent and spin coating the final layer onto the substrate. (A full description of spin coating is found in *Photoresist Materials and Processes*, W. S. DeForrest, page 223, McGraw-Hill, New York, 1975.) The spinning speed and resist solid concentration utilized in the coating procedure primarily determine the layer thickness and are controlled to yield the desired result.

The material of the overlying layer is negative acting and includes a polymer formed from at least one monomer chosen from Group I represented by:

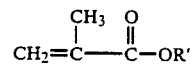

and at least one monomer chosen from Group II represented by:

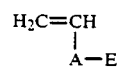

In the Group I monomers, the R' group is chosen to be a germanium-containing moiety such as a germanium alkyl or alkoxy represented by the formula:

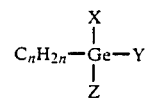

n being 1, 2, or 3 and X, Y, and Z being any combination of ethyl, methyl, or methoxy. In the monomers of Group II, A is chosen to be naphthyl or phenyl; E is chosen to be chloro, chloromethyl, dichloromethyl or bromomethyl; and E is substituted on the phenyl or naphthyl ring in a position which avoids steric effects precluding polymerization. Additionally, further substitution beyond the halogen or dihalogen methyl group on the naphthyl or phenyl ring, such as lower alkyl or halogen substitution where the polymer properties are not adversely affected, is acceptable. Additionally, the substituents should be chosen so that the $T_g$ of the copolymer is higher than 40° C., preferably higher than 60° C. However, the copolymers of this invention are significantly, e.g. 25%, more etch resistant to reactive ion etching (RIE) in an oxygen plasma than the corresponding silicon containing polymers. The copolymer of the overlying layer should be formed so that moieties corresponding to the Group I monomer constitute 60 to 95 mole percent, preferably 75 to 95 mole percent, of the total copolymer moieties resulting from Group I and Group II monomers. Typically, for mole percentages less than 60 percent, insufficient oxygen RIE resistance occurs, while for mole percentages greater than approximately 95 percent, the negative-acting copolymer tends to become excessively insensitive to radiation unless a copolymer with a weight average molecular weight above 500,000 is used. (For purposes of this disclosure, negative acting occurs when the unirradiated region is essentially completely removed and the irradiated region has at least 30 percent of its original thickness after development.) Generally, however, just as for the corresponding silicon containing copolymer the lower the percentage of the Group I monomer incorporated into the polymer, the lower the dose required for producing a negative image.

The polydispersity of the copolymer should preferably be 2.5 or less. Polydispersities higher than 2.5 generally produce lower contrasts and unduly degrade the resulting mask or device being fabricated. (Polydispersity is defined in *Polymer Chemistry*, Malcom P. Stevens, Addison-Wesley, 1973, Chapter 2.) Typically, the weight average molecular weight ($\overline{M}_w$) of the copolymer should also be in the range of 40,000 to 400,000. Weight average molecular weights lower than 40,000 require an excessively high dose for adequate exposure, while weight average molecular weights higher than 400,000 tend to unacceptably degrade solution.

It is typically desirable to use exposure doses, e.g., doses of deep UV or electron beam radiation having an acceleration potential of, for example, 20 kV, in the range of 10 to 500 millijoules/cm$^2$ and 1 to 20$\mu$ coulombs/cm$^2$, preferably 10$\mu$ coulombs/cm$^2$, respectively. (Deep UV light is radiation, for example, from a krypton-fluoride excimer laser or Hg-Xe high pressure lamp, having the desired dose intensity in the wavelength range between 220 and 290 nm.) Doses greater than 20$\mu$ coulombs/cm$^2$ (500 millijoules/cm$^2$) or less than 1$\mu$ coulombs/cm$^2$ (10 millijoules/cm$^2$) both lead to lost resolution. Additionally, doses greater than 20$\mu$ coulombs/cm$^2$ (500 millijoules/cm$^2$) require excessive exposure times.

The developing medium should be chosen so that the material remaining after development represents 30 to 95 percent by volume of the material present in those regions before exposure. A wide range of developers are suitable. For example, a 2:1 by volume mixture of methylethyl ketone in methanol is useful. Generally, solvents which strongly solvate the resist material, i.e., 100% methylethyl ketone, cause swelling and should be avoided. It is desirable that the resist material be baked before exposure to ensure film adhesion and removal of spinning solvent. Typically, this baking is accomplished at a temperature above the $T_g$ of the resist material, e.g., 70° to 100° C., but at a temperature sufficiently low to avoid decomposition. Baking times of 15 to 90 minutes are generally suitable. Baking after development is also desirable to remove developing solvents and, if necessary, to flow the images to the required size. Typically, temperatures in the range 90° to 180° C. are appropriate. Temperatures less than 90° C. are not desirable because they do not induce pattern flow, and temperatures above 180° C. are not desirable because of resist decomposition.

The polymers utilized in the invention are produced by techniques such as chemically initiated free-radical solution polymerization which is extensively described in a variety of texts such as *Principles of Polymerization*, G. Odian, Chapters 3 and 6, J. Wiley & Sons, New York, 1981. Briefly, this procedure involves codissolution of the monomers into a solvent, heating, and addition of an initiator such as benzoyl peroxide, in the absence of oxygen.

Pattern transfer from the overlying to the underlying region is typically accomplished by subjecting the substrate to an oxygen plasma. This oxygen plasma technique has been extensively described in *Introduction to Microlithography*, Chapter 6, edited by L. F. Thompson, C. G. Willson, and M. J. Bowden, American Chemical Society, Symposium Series 219, Washington, D.C. 1983. Typically, a planar geometry oxygen RIE plasma reactor operating at a pressure of 30 millitorr, with bias voltage of −330 volts and r.f. power density of 0.4 watts/cm$^2$, yields a removal rate for the underlying layer of 0.17 $\mu$m/minute. (Under these conditions, the overlying layer is etched at 0.004 $\mu$m/minute.) Generally, the plasma is struck in a gas containing oxygen. Total gas pressures in the range of 1 millitorr to 50 millitorr are generally employed.

After the pattern has been transferred to the underlying layer, the delineated resist is utilized to form a mask or a device through steps such a metallization, dopant diffusion, or etching. The resist is then removed, and the processing of the mask or substrate is completed.

The following Examples are illustrative of the invention:

EXAMPLE 1

Synthesis of Germanium Containing Monomer

Approximately 2.4 liter of n-butyl ether was placed in a 5 liter round bottom flask fitted with a stirrer, condenser, and septum inlet. Approximately 113 grams of magnesium metal chips were placed in the ether. Methyl bromide gas was then bubbled through the ether at a rate of 1.6 gm/minute for a time period of 5.5 hrs. Approximately 200 gm (107 ml) of germanium tetrachloride was mixed 1:1 by volume with n-butyl ether in a separate container. This mixture was then added dropwise to the n-butyl ether Grignard reaction mixture, with stirring. After the dropwise addition had been accomplished, the reaction mixture was heated to 75° C. and held at this temperature by the use of a heating mantle, for 16 hours. Up until this time, moisture and oxygen were rigorously excluded from the reaction mixture and all reagents used, by maintaining them under a blanket of dry argon. A sufficient amount of 3% aqueous sulfuric acid was then added to the reaction mixture to quench the reaction and to dissolve the magnesium salts. The heating mantle was then utilized to boil the two-phase aqueous/organic mixture. The resulting water and organic vapors were passed through a condenser and collected in the liquid state in a chilled round bottom receiving flask. As the mixture was heated, the more volatile components of the mixture were removed, and the boiling point of the mixture rose until a temperature of 106° C. was reached. At this point essentially all of the volatile tetramethyl germanium reaction product had been driven off and condensed into the receiving flask. The organic phase in the receiving flask was separated from the immiscible aqueous phase by inserting a syringe into this phase and withdrawing it from the flask. The organic phase was then dried over molecular sieves and distilled to yield tetramethyl germanium (boiling point 43° C. at 760 mm Hg pressure). The reaction yield was approximately 85%.

Approximately 99 gm of tetramethyl germanium was placed in a round bottom flask. The flask was placed in contact with an oil heating bath for temperature control of the flask contents. The flask was fitted with a 3 cm inside diameter fractionation column having a length of approximately 35 cm that was filled with glass rings. Positioned directly above this fractionating column was a Pyrex ® photochlorination column measuring approximately 3 cm inside diameter by 12 cm and above the photochlorination unit was positioned a condenser. Long wavelength UV light (approximately 330 nm peak) was made incident on the photochlorination unit, providing an intensity incident upon the photochlorination unit of about 150 $\mu$W/cm$^2$. The tetramethyl germanium was heated to the boiling point and chlorine gas was introduced at a flow rate of approximately 12 sccm through a glass tube into the photochlorination chamber. Boiling and chlorine flow was continued until the temperature of the boiling flask contents reached 114° C. (approximately 9.3 hours). The boil-up of tetramethyl germanium through the fractionating column and the ensuing photochlorination was maintained during this procedure by ensuring a temperature differential between the oil heating bath and the boiling flask contents of approximately 30° C. The reaction mixture was then fractionated by distillation to yield approximately 10% unreacted tetramethyl germanium and 55% chloromethyltrimethyl germanium (boiling point 114° C. at 760 mm Hg pressure), with the remainder being less volatile multi-chlorination products.

Approximately 225 ml of acetonitrile, 48 grams of potassium methacrylate, 2 grams of 18-crown-6 ether and 1 gram of hydroquinone was placed in a round bottom flask fitted with a condenser, stirrer, and septum inlet. The reaction mixture was heated to 80° C., using a heating mantle, and through the septum inlet approximately 45 grams of chloromethyltrimethyl germanium was added by syringe, in one aliquot. The reaction mixture was maintained for 65 hours at 80° C. with stirring. The reaction mixture was then cooled and filtered by vacuum suction through a fritted glass filter. The filtered solids were then washed with approximately 125 ml of acetonitrile and the wash filtrate combined with the first filtrate. The acetonitrile in the combined filtrate was removed by heating to 35° C. under vacuum. A 10:1 by volume mixture of n-hexane and methyl acetate was prepared. Approximately 50 ml of this mixture was added to the remaining reaction product. This combined mixture was then passed through a glass column containing 45 grams of silica adsorbent immersed in the n-hexane/methyl acetate mixture. The column was then washed with the n-hexane/methyl acetate mixture until IR analysis of the eluent showed no further trimethylgermylmethyl methacrylate. The n-hexane and methyl acetate present in the eluent were then removed under vacuum at 35° C. The remaining liquid was vacuum distilled at 4 mm Hg to yield pure trimethylgermylmethyl methacrylate (boiling point 58° C. at 4 mm Hg pressure).

EXAMPLE 2

Synthesis of Material

Trimethylgermylmethyl methacrylate and chloromethyl styrene (mixed meta and para isomers) were each individually distilled under vacuum. The distillates were stored at 0° C. under air until used. A polymerization reaction vessel was prepared by utilizing a 3-neck, 50 ml flask having a Teflon (Teflon is a registered trademark of E. I. duPont deNemours and Company, Inc.) stirrer, a gas/vacuum port, a condenser, and a septum inlet. An external glass jacket was incorporated with the vessel to facilitate temperature control by flowing heated water through the jacket. Approximately 26 ml of toluene, 0.7 grams of the chloromethyl styrene distillate, and 12.4 grams of the trimethylgermylmethyl methacrylate distillate were added to the reactor. The mixture was degassed under vacuum and the atmosphere in the reactor then replaced with argon. Agitation was then begun and the mixture was heated to 85° C. using the heat transfer jacket, while maintaining an argon atmosphere in the reactor. When the reactants reached a steady-state temperature, 4.5 milligrams of benzoyl peroxide dissolved in 2 ml toluene was added by syringe through the septum inlet. Additional benzoyl peroxide in the form of a 3.8 mg/ml toluene solution was added dropwise at a flow rate of 0.28 ml/hour over a 10.5 hour reaction period.

After the reaction period, the reaction was terminated by rapidly reducing the temperature of the reactor by passing cold water through the jacket. Approximately 25 ml of acetone was then added to the reaction mixture and the combined liquid was transferred to a 1500 ml beaker containing a well-stirred 650 ml solution of methanol and water (2:1 by volume). An oily mass was precipitated which settled to the bottom of the beaker after the stirring was stopped. After settling of the oily mass, the supernatant liquid was decanted from the beaker into a vacuum filter. Any oily material collected in the filter was recombined with the oil in the beaker by rinsing with acetone. The combined oils were then dissolved in the beaker by adding approximately 150 ml of acetone and allowed to sit overnight. This precipitation procedure was then repeated using the acetone solution obtained from the first precipitation. The volume of methanol/water utilized to induce precipitation was ten times the volume of the acetone solution obtained from the first precipitation procedure. The acetone solution was slowly added dropwise to the well-stirred methanol/water solution to yield a white fluffy precipitate. The precipitate was vacuum filtered and washed using the 2:1 methanol/water mixture and the resulting solids were dried under vacuum at room temperature. The product had a weight average molecular weight and polydispersity of $2.07 \times 10^5$ and 2.09, respectively as determined by high pressure size exclusion chromatography. The polymeric product contained 90 mole percent of moieties corresponding to the trimethylgermylmethyl methacrylate monomer and 10 mole percent of moieties corresponding to the chloromethyl styrene monomer, as determined by proton NMR and elemental analysis.

EXAMPLE 3

The same procedures, as in Examples 1 and 2, were followed except 12.5 and 11.2 grams of the trimethylgermylmethyl methacrylate monomer and 1.7 and 2.6 grams of the chloromethyl styrene monomer were used to yield respectively a polymer having 80 and 70 mole percent of moieties corresponding to the trimethylgermylmethyl methacrylate.

EXAMPLE 4

A sufficient amount of the copolymer prepared in Example 2 was added to 2-methoxyethyl acetate to yield an 11.5 percent weight/volume solution. The resulting solution was filtered at least 3 times through a filter stack including a 1 $\mu$m, 0.5 $\mu$m, and 0.2 $\mu$m average pore size Teflon filter. The surface ((100) crystallographic plane) of a 4-inch silicon substrate was coated with a 1.2 $\mu$m thick layer of HPR-204 resist (a novolac cresol resin with a quinone diazide sensitizer which is a proprietary product of Philip A. Hunt Chemical Company) by spin coating at 4000 rpm. The coated substrate was baked in air at 210° C. for 1 hour. A 0.40 μm film of the copolymer synthesized in Example 2 was then deposited onto the HPR-204 resist layer by spin coating at 1500 rpm. The resulting bilayer structure was then baked at 90° C. in air for 30 minutes.

The substrates were exposed utilizing an electron beam exposure system having a 20 kilovolt accelerating potential, a 0.25 μm beam address size, and a 0.25 μm spot size. The beam was addressed to produce a 10×10 array of test patterns. (Each test pattern had feature sizes ranging from 0.25 to 4 μm.) Each array element was exposed at a different dose, with total doses ranging from 1.0μ coulomb/cm² to 10 μ coulomb/cm². After exposure, the substrates were spray developed in an APT Model 915 resist processor, using methyl ethyl ketone/methanol as the developer. The substrates were then baked in air at 90° C. for 30 minutes.

Sensitivity, defined as the dose required to yield a 50 percent thickness of exposed to unexposed region, was 3.0μ coulomb/cm². Contrast, defined as in *CRC Critical Reviews in Solid State Science*, M. J. Bowden, page 231 (February 1979), was 1.6. (Film thickness for these measurements were obtained utilizing a DEKTAK Model 11A profilometer).

EXAMPLE 5

A bilayer structure composed of an underlying layer of hard-baked HRR-204 resist (1.2 μm) and an overlying layer of the copolymer synthesized in Example 2 (0.4 μm) was prepared on a silicon substrate as described in Example 4. The substrate was exposed in proximity mode using an exposure tool fitted with a KrF excimer laser operating at 248 nm with an output of 11 mJ/cm²/sec at 100 Hz. Test patterns were projected providing doses at the resist surface ranging from 5 to 500 mJ/cm². The exposed resist was developed as described in Example 4. The patterned substrate was then baked in air at 90° C. for 30 minutes. The sensitivity and contrast were 56 millijoules/cm² and 1.9, respectively. (Thicknesses were measured using a DEKTAK Model 11A profilometer.)

EXAMPLE 6

The surface ((100) crystallographic plane) of a 4-inch silicon substrate was coated with a 0.40 μm film of the copolymer synthesized in Example 2 by spin coating at 1500 rpm (as in Example 4) followed by baking at 90° C. in air for 30 minutes. The substrate were placed on the sample holder of a parallel plate RIE plasma reactor. Pure oxygen was introduced at a flow rate of approximately 20 sccm to yield a pressure of approximately 30 mtorr. A plasma was struck utilizing a dc bias of approximately −330 volts and an r.f. (13.6 MHz) power density of 0.42 watts/cm², and was maintained for up to 32 minutes. The resulting etching rate was approximately 35 Å/min, and the etch rate selectivity compared to hard-baked HPR-204 (rate HPR-204/rate germanium copolymer) was approximately 45.

We claim:

1. A process for fabricating an article comprising the steps of forming a negative-acting radiation-sensitive region on a substrate, patterning at least a portion of said region, and further processing said substrate characterized in that said region comprises a composition formed by a polymerization process employing (1) at least one material represented by the formula:

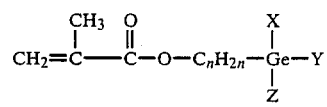

where n = 1, 2 or 3 and x, y, and z are individual methyl, ethyl, or methoxy moieties and (2) at least one material represented by the formula:

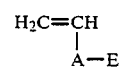

where A is a naphthyl or phenyl moiety, and E is chosen from the group consisting of chloro, chloromethyl, dichloromethyl, and bromomethyl.

2. The process of claim 1 wherein said article comprises a device.

3. The process of claim 1 wherein said article comprises a lithographic mask.

4. The process of claim 1 wherein said composition is formed by a copolymerization process.

5. The process of claim 1 wherein a region capable of selective removal is interposed between said radiation-sensitive region and said substrate.

6. The process of claim 5 wherein said patterning comprises the step of subjecting said region to said radiation and then subjecting said region to a plasma discharge.

7. The process of claim 6 wherein said region capable of selective removal undergoes said removal by being subjected to a solvent.

8. The process of claim 6 wherein said plasma discharge comprises an oxygen plasma discharge.

* * * * *